United States Patent
Schaefer et al.

(10) Patent No.: US 10,598,720 B2
(45) Date of Patent: Mar. 24, 2020

(54) METHOD FOR INSULATION FAULT LOCATION AND AN INSULATION FAULT LOCATION SYSTEM FOR AN UNGROUNDED POWER SUPPLY SYSTEM

(71) Applicant: Bender Gmbh & Co. KG, Gruenberg (DE)

(72) Inventors: Oliver Schaefer, Gruenberg (DE); Helmut Becker, Gruenberg (DE); Carsten Hartmann, Schotten (DE)

(73) Assignee: BENDER GMBH & CO. KG, Gruenberg (DE)

( * ) Notice: Subject to any disclaimer, the term of this patent is extended or adjusted under 35 U.S.C. 154(b) by 58 days.

(21) Appl. No.: 16/002,411

(22) Filed: Jun. 7, 2018

(65) Prior Publication Data

US 2018/0356456 A1    Dec. 13, 2018

(30) Foreign Application Priority Data

Jun. 8, 2017   (DE) .......................... 10 2017 209 663

(51) Int. Cl.
*G01R 31/12* (2020.01)
*G01R 31/08* (2020.01)
*G01R 27/18* (2006.01)
*G01R 31/02* (2006.01)

(52) U.S. Cl.
CPC ......... *G01R 31/1272* (2013.01); *G01R 27/18* (2013.01); *G01R 31/025* (2013.01); *G01R 31/08* (2013.01); *G01R 31/083* (2013.01)

(58) Field of Classification Search
CPC .. G01R 31/1272; G01R 31/083; G01R 31/08; G01R 31/025; G01R 27/18; G01R 31/14; G01R 31/086
See application file for complete search history.

(56) References Cited

U.S. PATENT DOCUMENTS

| | | | |
|---|---|---|---|
| 10,020,649 B2 * | 7/2018 | Du | ......................... H02H 3/335 |
| 2015/0077130 A1 * | 3/2015 | Hackl | ................ G01R 19/0092 |
| | | | 324/522 |

FOREIGN PATENT DOCUMENTS

| | | |
|---|---|---|
| DE | 10106200 C1 | 9/2002 |
| DE | 102015102310 A1 | 8/2016 |
| EP | 0654673 A1 | 5/1995 |
| EP | 1593983 A1 | 11/2005 |
| EP | 3109647 A1 | 12/2016 |

* cited by examiner

*Primary Examiner* — Patrick Assouad
*Assistant Examiner* — Haidong Zhang
(74) *Attorney, Agent, or Firm* — King & Schickli, PLLC

(57) ABSTRACT

The invention relates to a method for insulation fault location as well as to an insulation fault location system for an ungrounded power supply system.

Figure 1:
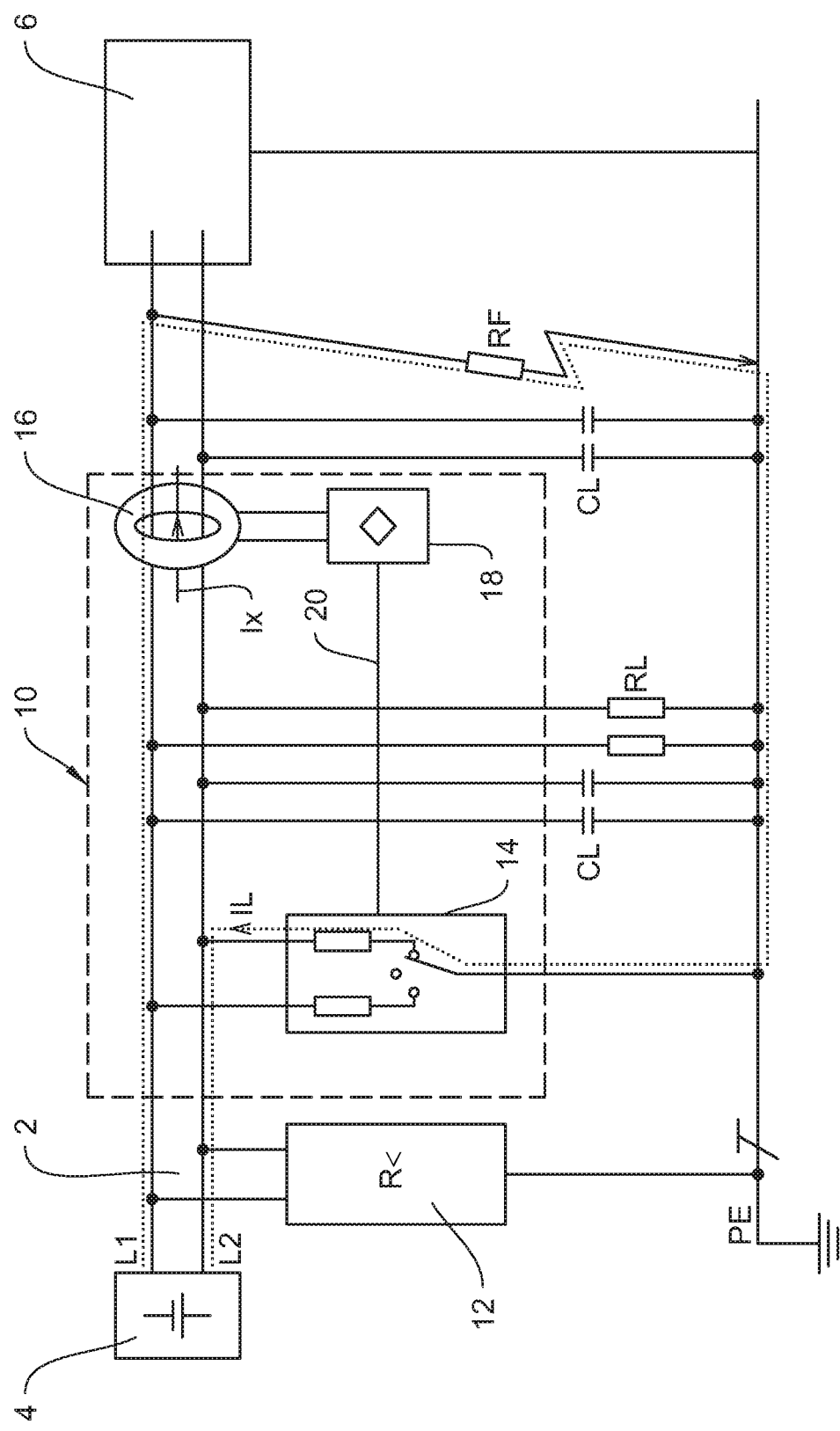

The main idea of the present invention rests upon the idea that while preserving a predetermined maximally admissible test current amplitude, a test current pulse duration of a test current is adaptively set such that all interfering values are eliminated in a captured differential current, in particular the leakage currents arising in consequence of large supply leakage capacitances.

Should a test of the value of the final value of the differential current reveal that a test current threshold value has been exceeded, this exceedance can be seen as an indicator that the respective conductor section is therefore in the fault circuit.

12 Claims, 2 Drawing Sheets

Fig. 2
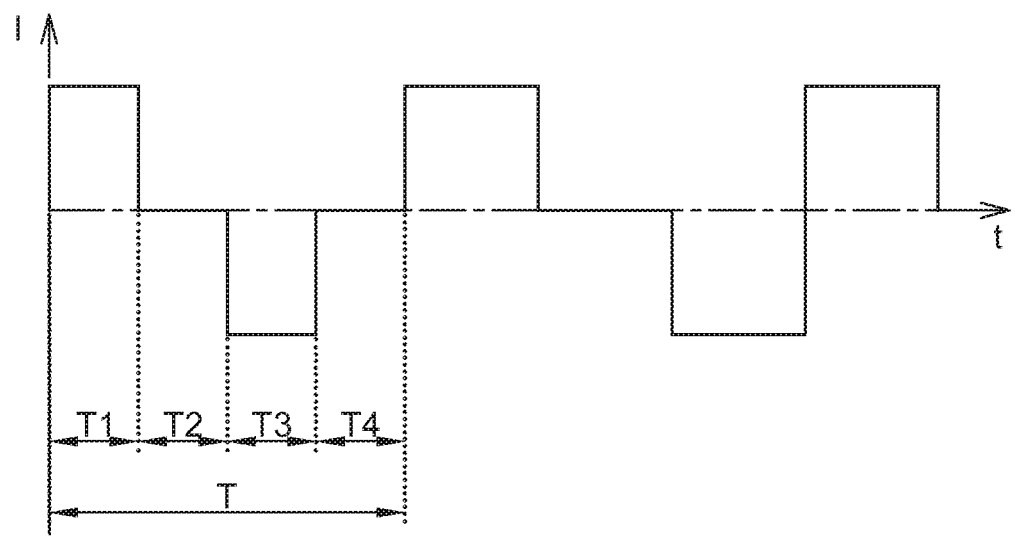
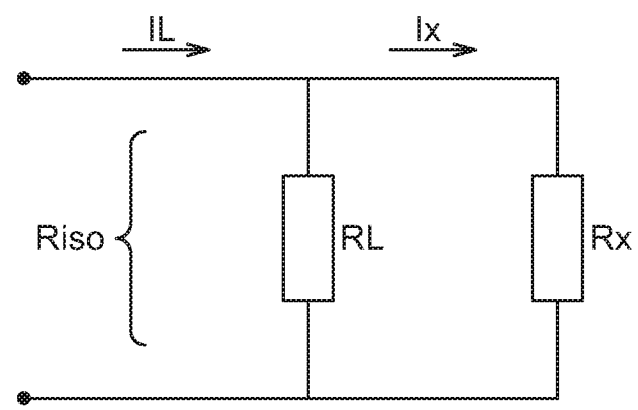
Fig. 3

METHOD FOR INSULATION FAULT LOCATION AND AN INSULATION FAULT LOCATION SYSTEM FOR AN UNGROUNDED POWER SUPPLY SYSTEM

This application incorporates by reference the disclosure of German Patent Application no. 10 2017 209 663.2, filed Jun. 8, 2017.

TECHNICAL FIELD

The invention relates to a method for insulation fault location as well as to an insulation fault location system for an ungrounded power supply system.

BACKGROUND

For higher requirements to the operational, fire and contact safety, the network configuration of an ungrounded power supply system is used which is also referred to as an isolated network (French: Isolé Terre—IT) or as an IT power supply system. In this kind of power supply system, the active parts are separate from the ground potential—with respect to "ground". The advantage of these networks rests upon the fact that the functionality of the connected electrical user is not impaired by an insulation fault (first fault), e.g. a ground fault or body contact, since a closed circuit cannot be formed between an active conductor of the network and ground due to the infinitely large impedance value under ideal circumstances (supply leakage capacitances are to be disregarded in this instance).

Owing to this inherent safety of the ungrounded power supply system, a continuous power supply of the user fed by the ungrounded power supply system can thus be ensured if a first insulation fault arises.

The resistance of the ungrounded power supply system against ground (insulation resistance—also an insulation fault resistance or fault resistance in a fault event) is therefore constantly monitored since a fault loop would arise via a possible other fault at a different active conductor (second fault) and the fault current flowing in this process together with an overcurrent protective device would cause a shut down of the installation resulting in an operational standstill.

Provided that the insulation state of the ungrounded power supply system is continuously monitored by an insulation monitoring device, the ungrounded power supply system can remain in operation without a predetermined time limitation even if a first fault has arisen; however, it is recommended to eliminate the first fault as soon as practicably possible.

In order to fulfil the requirements after the quick elimination of the first fault, the use of an insulation fault location system poses the state of the art in widely branched ungrounded power supply systems, in particular in extended ungrounded power supply systems, or in ungrounded power supply systems, in which a shut down of the power supply can be critical to safety.

The insulation fault location system essentially comprises a test current generator and several test current sensors mostly designed as measuring current transformers, which are connected to an insulation fault location device (insulation fault evaluation device) for evaluating the measuring signal.

If a first insulation fault has been identified in the ungrounded power supply system by the insulation monitoring device, the insulation fault location is commenced by the test current generator generating a test current and feeding this test current into the ungrounded power supply system at a central location between one or several active conductors and ground (supplied test current). A closed circuit is formed in which the test current flows from the test generator via the live active conductor, the insulation fault and via a ground connection and flows back to the test generator.

The fault location is localized via a detection of the test current in the ungrounded power supply system via the insulation fault location device using the measuring current transformers connected thereto, a measuring current transformer being specifically assigned to each cable section to be monitored. The test current detected thus corresponds to a capturable test current in the conductor section to be monitored, a negligible steady test current portion flowing outside of the fault circuit via the ohmic portions of the leakage impedances.

The respective capturable test current is captured as a differential current by all measuring current transformers, which are in the test current circuit (fault circuit) and are evaluated and indicated in the insulation fault location device. The fault location can be localized via the known assignment of the measuring current transformers to the conductor branches.

However, the capture of the test current reaches its limits because the network leakage capacitances take up non-negligible values in particular in widely branched ungrounded power supply systems and consequently (leakage) differential currents can arise which disturb the test current.

Another disadvantage of the hitherto used methods for insulation fault location is that the test current is limited to a maximum value with regard to the safety of persons and the installation. Upper threshold values in the range of 1 mA to 2.5 mA maximum are required, for example, for test currents in conjunction with sensitive installation parts—even with larger supply leakage capacitances of 10 µF to 1,000 µF.

Specifically in conjunction with high-impedance insulation faults and an amperage resulting therefrom in the fault circuit, a safe capture and evaluation of the test current and thus a reliable localization of the fault location are therefore not always ensured.

These problems are presently only met by an inadmissible exceedance of the maximally admissible test current or by a successive shut down of installation parts in conjunction with high expenditures of cost and time.

SUMMARY

The object of the invention at hand is therefore to propose a method and a system for insulation fault location in an ungrounded power supply system, which both enable a localization of the insulation fault which is reliable from a technical viewpoint as well as efficient with regard to expenditure of time and cost in particular when high-impedance insulation faults arise in conjunction with large network leakage capacitances while simultaneously preserving the safety of persons and the installation.

This object is attained by a method for insulation fault location in an ungrounded power supply system which comprises the following method steps to be carried out repeatedly: generating a periodic test current by means of a test current generator, said test current comprising a predetermined maximum test current amplitude and a test current period having a changeable test current period duration and said test current period being compiled from temporally consecutive test current pulses and test current pauses; feeding the test current into the ungrounded power supply system; capturing a differential current in a cable section to be monitored; determining a steady state of the differential current and determining a respective settling time/decay time; determining a final value of the differential current in the steady state of the differential current; testing whether the final value of the differential current exceeds a test current threshold value according to magnitude in order to identify a capturable test current; transmitting the value of the settling time/decay time to the test current generator; and setting a test current pulse duration/a test current pause duration as a function of the transmitted settling time/decay time using the test current generator such that the differential current reaches its final value within the test current pulse duration/test current pause duration, said predetermined maximum test current amplitude remaining unchanged.

The main idea of the invention at hand rests upon the idea that while preserving a predetermined maximally admissible test current amplitude, the test current pulse duration or the test current pause duration of the test current is set such that all interfering values in the captured differential current, in particular the leakage currents arising in consequence of large supply leakage capacitances, are eliminated. The test current can thus be captured in a widely branched ungrounded power supply system even under unfavorable circumstances of the installation.

For this purpose, a test current having a periodic progression is first generated by means of a test current generator and is fed into the ungrounded power supply system between one or several active conductors and ground. A test current period of the periodic test current is compiled from temporally consecutive test current pulses and test current pauses (base lines) therebetween.

The test current pulse duration or the test current pause duration is adaptively set as a function of the captured and evaluated differential current while carrying out the method (cf. following method steps) whereas the amplitude of the test current pulse is limited to a maximum value (maximum test current amplitude) predetermined by the type and composition of the electric installation.

The limitation of the test current amplitude promotes the safety of persons and the installation and thus precludes any danger to safety while localizing faults.

The test current flowing in the fault circuit is tracked by capturing differential currents using measuring current transformers distributed along the cable sections to be monitored, said measuring current transformers being connected to an insulation fault location device for evaluating the captured differential currents.

As long as the cable section to be monitored is in the fault circuit, a significant portion of the supplied test current can be captured as a differential current in this cable section (capturable test current). Generally, the captured differential current is compiled from the capturable test current and dynamic decaying parasitic portions (capacitive network leakage currents) as well as other static (absolute) parasitic circuits caused by the installation. In order to eliminate the dynamic decaying interfering components within the captured differential current, a final value of the differential current is determined. A steady value of the differential current is referred to as a final value in this instance and is set after a settling process as a reaction to turning on a test current pulse as well as after a decay process as a reaction to shutting off the test current pulse.

After the recharging processes of the network leakage capacitances have decayed, a steady state of the captured differential value is set if a test current pulse or a test current pause is sufficiently long. As soon as this steady state is determined at the measuring location, for example by evaluating the oscillation width of the captured differential current amplitude or by evaluating the temporal changes in the differential current amplitude progression, the final value of the differential current and the respective settling time or decay time are determined by the insulation fault monitoring device.

In order to measure the final value, all-current sensitive type-B measuring current transformers are used, which are capable of capturing smooth DC differential currents besides AC differential currents and pulsing DC differential currents.

If a test of the value of the final value of the differential current reveals an exceedance of a test current threshold value, this exceedance can be seen as an indicator that a test current or at least a significant portion of the test current flows in the respective conductor section and that the respective conductor section consequently is in the fault circuit.

A decaying differential current caused by leakage currents is eliminated by determining the final value, with in particular the negative impacts of particularly large network leakage capacitances in the range of 10 µF to 1,000 µF being eliminated and fault measurements being able to be avoided in this manner.

If by means of measuring a differential current the capturable test current was determined in the conductor section to be monitored by exceeding the test current threshold value, the value of the settling time or the decay time is transmitted from the insulation fault location device to the test generator via a communicative connection.

Subsequently, the test current pulse duration or the test current pause duration is set as a function of the transmitted settling time or decay time by the test current generator such that the differential current reaches its final value within the test current pulse duration or the test current pause duration.

The predetermined maximum test current amplitude remains unchanged in this context. The test current period duration generated in the test current generator is thus adapted to the settling time determined in the insulation monitoring device. At the same time, maximally admissible test current amplitudes in the range of 1 mA to 2.5 mA are met.

Adaptively setting the test current pulse duration or the test current pause duration as a function of the detected settling time ensures a localization of the insulation fault which is reliable from a technical viewpoint as well as efficient with regard to the expenditure of time and cost while simultaneously preserving safety regulations.

The following advantageous method steps are given in the following: a first differential current base value is determined when the test current pulse has decayed; a settling differential value is formed between the differential current final value and the first differential current base value after supplying the test current pulse when the test current pulse has settled; a second differential current base value is determined after the test current pulse has decayed; a decay differential value is formed between the differential current final value and the second differential current base value. Should the settling differential value coincide with the decay differential value within a tolerance range, a valid capture of the differential current is available in order to identify the capturable test current.

Even though the dynamic decaying parasitic currents are eliminated by observing the final value of the differential current, the static parasitic currents caused by the installation are still captured in the settled state of the test current and can lead to errors regarding the identification of a captured test current.

Therefore, a first differential current base value is first determined at the end of a test current pause when the test current pulse has decayed. Between this first differential current base value and the differential current final value determined in the settled state, a settling differential value is formed which should correspond to a differential current portion caused by the supplied test current pulse.

In order to test whether the capturable test current is identified without error within the captured differential current, a second differential current base value is determined after the test current pulse has decayed and a decay differential value is formed between the differential current final value and the second differential current base value. Provided that an available static parasitic current is constant, the settling differential value and the decay differential value should be the same under consideration of a determined tolerance range (range window). In this instance, the settling differential value or the decay differential value corresponds to a differential current portion caused by the supplied test current pulse and consequently corresponds to the capturable test current. An existing static parasitic current is computationally eliminated in this manner.

In another advantageous embodiment, a partial insulation resistance of the conductor section to be monitored is determined from an overall insulation resistance of the ungrounded power supply system detected by an insulation monitoring device, from the supplied test current and from the final value of the differential current.

Since the overall insulation resistance Riso of the ungrounded power supply system was always monitored and detected by the insulation monitoring device before commencing the insulation fault location, this overall insulation resistance Riso can be consulted for calculating the partial insulation resistance Rx of the conductor section to be monitored. According to Ohm's Law and the current-voltage relations, which are valid in linear networks, the partial insulation resistance Rx of the conductor section to be monitored can be calculated from the relation of the supplied test current IL to the test current capturable as a final value Ix of the differential current:

$$Rx = Riso(IL/Ix).$$

Preferably, the test current period is formed temporally consecutively from a positive test current pulse, a positive test current pause, a negative test current pulse and a negative test current pause.

Such a progression of the test current can be easily generated by using an active voltage or power source as well as in a passive form, driven by the supply voltage.

The test current in the test current generator can therefore be actively generated by an independent voltage or power source within the test current generator.

In this instance, the test current generator is realized as an autonomous active device or as a functioning unit integrated in the insulation monitoring device and comprises an independent voltage or power source for generating the test current. This embodiment allows carrying out the insulation fault location even in shut-down ungrounded power supply systems.

Alternatively, the test current is generated passively in the test current generator, said test current being driven between an active conductor of the power supply system and ground by the supply voltage.

As an autonomous active device or as a passive functioning unit integrated in the insulation monitoring device, a pulse-shaped voltage driving the test current is generated by alternatingly connecting the active conductors of the power supply system to ground, while simultaneously limiting the test current amplitude.

The object of the invention is further attained by an insulation fault location system for an ungrounded power supply system, having a test current generator for generating and supplying a periodic test current; having an insulation fault location device for evaluating differential currents which are captured by measuring current transformers connected to the insulation fault location device; said insulation fault location device comprising: a computing unit for determining a steady state of the differential current, for determining a respective settling time/decay time, for determining a final value of the captured differential current and for testing whether the final value of the differential current exceeds a test current threshold value according to value; and a transmitting device for transmitting the value of the settling time/decay time to the test current generator; and said test current generator comprising a test current setting device for setting a test current pulse duration/a test current pause duration as a function of the transmitted settling time/decay time, the predetermined maximum test current amplitude remaining unchanged.

In order to implement the method for insulation fault location according to the invention, an insulation fault location system according to the invention comprises the following as essential components: a test current generator having a test current setting device; an insulation fault location device having a computing unit and having a transmitting device; as well as measuring current transformers connected to the insulation fault location device.

Advantageously, the computing unit is further configured for determining a first differential current base value, a settling differential value, a second differential current base value, a decay differential value, and for testing whether the settling differential value coincides with the decay differential value within a tolerance range.

This embodiment of the computing unit enables reliably identifying the capturable test current in the scope of a plausibility check by checking the settling differential value and the decay differential value for equality in the scope of a determined tolerance range. Should an inequality be determined due to an inconstant static parasitic current, the identification of the capturable test current is then dismissed as being unreliable.

As another advantageous embodiment, the insulation fault location system comprises a determining device for determining a partial insulation resistance of the conductor section to be monitored, said partial insulation resistance being determined from an overall insulation resistance of the ungrounded power supply system determined by an insulation monitoring device, from the supplied test current and from the final value of the differential current.

Furthermore, the test current setting device is designed such that the test current period is compiled from test current pulses and test current pauses, said test current periods being temporally consecutively formed from a positive test current pulse, a positive test current pause, a negative test current pulse and a negative test current pause.

The test current generator is designed as an active device, which generates the test current via an independent voltage or power source, or the test current generator is a passive device, said test current being driven by the supply voltage between an active conductor of the power supply system and ground.

For this purpose, the test current generator can be designed as an autonomous device or as a functioning unit integrated in the insulation monitoring device.

BRIEF DESCRIPTION OF THE DRAWING FIGURES

Further advantageous features of the embodiments can be derived from the following description and the drawings, which describe a preferred embodiment of the invention by means of examples. In the following, FIG. 1 shows an ungrounded power supply system having an insulation fault location system according to the invention, FIG. 2 shows a progression of a periodic supplied test current, and FIG. 3 shows an equivalent circuit diagram for detecting a partial insulation resistance of a conductor section to be monitored.

DETAILED DESCRIPTION

In FIG. 1 an ungrounded power supply system 2 having an insulation monitoring device 10 is shown in a schematically simplified view. The ungrounded power supply system 2 has two active conductors L1, L2 and is fed by a DC source 4. In general, the method according to the invention for insulation fault location and the insulation fault location device 10 implementing the method can be used in any arbitrary single- or multiple-phased DC or AC networks.

A user 6, which is connected to a ground potential (ground) via a ground connection, is connected to the ungrounded power supply system 2. The active parts of the ungrounded power supply system 2 do not have a ground connection so that ideally no closed fault circuit can be formed—i.e. except leakage currents via network leakage impedances RL, CL,—when a first fault arises (shown in FIG. 1 by the insulation fault resistance RF).

An overall insulation resistance Riso (FIG. 3) of the ungrounded power supply system 2 is continuously monitored by means of an insulation monitoring device 12. If the detected overall insulation resistance Riso falls below a threshold value when the insulation fault (insulation fault resistance RF) arises, the insulation fault location commences by a test current generator 14 generating a test current IL and feeding said test current IL into the ungrounded power supply system 2 between the active conductors L1, L2 and ground PE close to the supplying current source 4 (supplied test current IL).

The test current generator 14 is passively designed and generates a pulse-shaped supplied test current IL (FIG. 2), which is driven through the alternatingly connected supply voltage, by alternatingly connecting the active conductors L1, L2 of the power supply system 2 to ground PE. Alternatively to connecting the supply voltage as a driving test current source, the test current generator 14 can contain an autonomous voltage or power source driving the supplied test current IL.

A substantial portion of the supplied test current IL flows as a capturable test current in a closed fault circuit via the insulation fault resistance RF and the ground connection PE and can be detected by a measuring current transformer 16 as a differential current in a cable section to be monitored.

The measuring current transformer 16 is connected to an insulation fault location device 18 for evaluating the measurement results.

After the recharging processes in the inherently existing leakage capacitances—shown via the concentrated network discharge capacitances CL in FIG. 1—have decayed, the differential current attains a steady state. The settling time from the start of the test current pulse until attaining a steady state (settled state) as well as the decay time from the start of the test current pause until attaining a steady state (settled state) and the steady final value Ix of the differential current in the respective steady state are determined by the insulation fault location device 18. Should the value of the final value Ix exceed a test current threshold value, it can be presumed that a capturable test current flows via the cable section to be monitored and said cable section is in the fault circuit.

The respective value of the settling time or decay time is transmitted to the test current generator 14 via a transmitting device 20, which can be designed as a bus system. Hence, the test current generator 14 sets the test current pulse duration (T1, T3 in FIG. 2) or the test current pause duration (T2, T4 in FIG. 2) such that the captured differential current reaches its final value (Ix) within the test current pulse duration (T1, T3) or within the test current pause duration (T2, T4), respectively.

The insulation fault location device 18 adaptively gives the values of the test current pulse duration (T1, T3) or of the test current pause duration (T2, T4) to be set in the test current generator 14 by determining and transmitting the settling duration and thus determines at which point in time the test current pulses are turned on and shut off.

FIG. 2 shows a progression of a periodic supplied test current IL having a test current period, which is formed temporally consecutively from a positive test current pulse, a positive test current pause, a negative test current pulse and a negative test current pause.

The test current period has a test current period duration T, which is compiled from the consecutive periods T1 (positive test current pulse duration), T2 (positive test current pause duration), T3 (negative test current pulse duration) and T4 (negative test current pause duration).

Due to the adaptive setting, the test current pulse duration (T1, T3) and the test current pause duration (T2, T4) can change.

In FIG. 3, a simplified equivalent circuit diagram for detecting a partial insulation resistance Rx of a conductor section to be monitored is shown.

The overall insulation resistance Riso of the ungrounded power supply system 2 (only the substantial ohmic portion of the complex-valued insulation resistance is to be observed in this instance) comprises all ohmic resistances RL, which are available between the active conductors L1, L2 and ground, including the insulation fault resistance RF and is just as known due to the insulation monitoring as the test current IL supplied in the insulation fault location and as the final value Ix of the captured differential current.

From these values, the partial insulation resistance Rx of the conductor section to be monitored can be calculated:

$$Rx = Riso(IL/Ix).$$

The invention claimed is:

1. A method for insulation fault location in an ungrounded power supply system (2), comprising the method steps to be carried out repeatedly:

generating a periodic test current (IL) by means of a test current generator (14), said test current (IL) comprising a predetermined maximum test current amplitude and a test current period having a changeable test current period duration (T) and said test current period being compiled from temporally consecutive test current pulses and test current pauses, feeding the test current (IL) into the ungrounded power supply system (2), capturing a differential current in a cable section to be monitored, characterized by determining a steady state of the differential current and determining a settling time and a decay time respectively, determining a final value (Ix) of the differential current in the steady state of the differential current, testing whether the final value (Ix) of the differential current exceeds a test current threshold value according to magnitude in order to identify a capturable test current, transmitting the value of the settling time and of the decay time to the test current generator (14), setting a test current pulse duration (T1, T3) and a test current pause duration (T2, T4) as a function of the transmitted settling time and of the transmitted decay time respectively using the test current generator (14) such that the differential current reaches its final value (Ix) within the test current pulse duration (T1, T3) and within the test current pause duration (T2, T4) respectively, said predetermined maximum test current amplitude remaining unchanged.

2. The method according to claim 1,
characterized in that
a first differential current base value is determined when the test current pulse has decayed,
a settling differential value is formed between the differential current final value (Ix) and the first differential current base value after supplying the test current pulse when the test current pulse has settled,
a second differential current base value is determined after the test current pulse has decayed,
a decay differential value is formed between the differential current final value (Ix) and the second differential current base value,
should the settling differential value coincide with the decay differential value within a tolerance range, a valid capture of the differential current is available in order to identify the capturable test current.

3. The method according to claim 1,
characterized in that
a partial insulation resistance (Rx) of the conductor section to be monitored is determined from an overall insulation resistance (Riso) of the ungrounded power supply system (2) determined by an insulation monitoring device (12), from the supplied test current (IL) and from the final value (Ix) of the differential current.

4. The method according to claim 1,
characterized in that
the test current period is formed temporally consecutive from a positive test current pulse, a positive test current pause, a negative test current pulse and a negative test current pause.

5. The method according to claim 1,
characterized in that
the test current (IL) is actively generated in the test current generator (14) via an independent voltage or power source within the test current generator (14).

6. The method according to claim 1,
characterized in that
the test current (IL) is passively generated in the test current generator (14), said test current (IL) being driven via the supply voltage between an active conductor (L1, L2) of the power supply system (2) and ground.

7. An insulation fault location system (10) for an ungrounded power supply system (2),
having a test current generator (14) for generating and supplying a periodic test current,
having an insulation fault location device (18) for evaluating differential currents which are captured by measuring current transformers (16) connected to the insulation fault location device (18),
characterized in that
the insulation fault location device (18) comprises a computing unit for determining a steady state of the differential current, for determining a settling time and a decay time respectively, for determining a final value (Ix) of the captured differential current and for testing whether the final value (Ix) of the differential current exceeds a test current threshold value according to value,
and by a transmitting device (20) for transmitting the value of the settling time and of the decay time to the test current generator (14),
and in that the test current generator (14) comprises a test current setting device for setting a test current pulse duration (T1, T3) and a test current pause duration (T2, T4) as a function of the transmitted settling time and of the transmitted decay time respectively, the predetermined maximum test current amplitude remaining unchanged.

8. The insulation fault location system (10) according to claim 7, characterized in that
the computing unit is configured for determining a first differential current base value, a settling differential value, a second differential base value, a decay differential value, and for testing whether the settling differential value coincides with the decay differential value within a tolerance range.

9. The insulation fault location system (10) according to claim 7, characterized by
a determining device for determining a partial insulation resistance (Rx) of the conductor section to be monitored from an overall insulation resistance (Riso) of the ungrounded power supply system (2) determined by an insulation monitoring device (12), from the supplied test current (IL) and from the final value (Ix) of the differential current.

10. The insulation fault location system (10) according to claim 7, characterized in that
the test current setting device is carried out such that the test current period is compiled from test current pulses and test current pauses, said test current period being formed temporally consecutively from a positive test current pulse, a positive test current pause, a negative test current pulse and a negative test current pause.

11. The insulation fault location system (10) according to claim 7, characterized in that
the test current generator (14) is designed as an active device which generates the test current (IL) via an independent voltage or power source.

12. The insulation fault location system (10) according to claim 7, characterized in that
the test current generator (14) is designed as a passive device, the test current (IL) being driven through the supply voltage between an active conductor (L1, L2) of the power supply system (2) and ground.

\* \* \* \* \*